(12) United States Patent
Gunji et al.

(10) Patent No.: US 8,653,458 B2
(45) Date of Patent: Feb. 18, 2014

(54) CHARGED PARTICLE BEAM DEVICE

(75) Inventors: Yoshiro Gunji, Mito (JP); Shuji Kikuchi, Yokohama (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/812,121

(22) PCT Filed: Jun. 22, 2011

(86) PCT No.: PCT/JP2011/003553
§ 371 (c)(1),
(2), (4) Date: Jan. 24, 2013

(87) PCT Pub. No.: WO2012/014373
PCT Pub. Date: Feb. 2, 2012

(65) Prior Publication Data
US 2013/0126732 A1    May 23, 2013

(30) Foreign Application Priority Data

Jul. 28, 2010   (JP) .................................. 2010-168771

(51) Int. Cl.
*G01N 23/00*   (2006.01)

(52) U.S. Cl.
USPC ........... 250/310; 250/306; 250/307; 250/309; 250/311; 250/491.1

(58) Field of Classification Search
USPC ............. 250/306, 307, 309, 310, 311, 396 R, 250/491.1, 492.1, 492.2, 492.3
See application file for complete search history.

(56) References Cited

U.S. PATENT DOCUMENTS

| | | | |
|---|---|---|---|
| 6,172,363 B1 | 1/2001 | Shinada et al. | |
| 7,241,991 B1 * | 7/2007 | Standiford et al. | 250/306 |
| 2009/0062934 A1 * | 3/2009 | Fujita et al. | 700/33 |
| 2009/0123059 A1 * | 5/2009 | Gunji et al. | 382/147 |
| 2009/0206257 A1 * | 8/2009 | Gunji et al. | 250/310 |
| 2011/0274341 A1 | 11/2011 | Shirahata et al. | |

FOREIGN PATENT DOCUMENTS

| | | |
|---|---|---|
| JP | 4-017248 A | 1/1992 |
| JP | 11-161633 A | 6/1999 |
| JP | 2004-227886 A | 8/2004 |
| JP | 2005-142038 A | 6/2005 |
| WO | WO-01/69643 A1 | 9/2001 |

OTHER PUBLICATIONS

International Search Report issued in International Application No. PCT/JP2011/003553 mailed on Aug. 2, 2011.

* cited by examiner

*Primary Examiner* — Michael Logie
(74) *Attorney, Agent, or Firm* — McDermott Will & Emery LLP

(57) ABSTRACT

An inspection device carries out beam scanning on a stable scanning cycle by enabling flexible change of various scanning sequences according to inspection conditions thereof, and at the same time, eliminates as much unevenness as possible in scanning cycle which hinders stabilization of charging. A beam scanning scheduler schedules beam scanning based on an inputted scanning condition, and a programmable sequencer carries out beam scanning control according to a beam scanning schedule generated by the beam scanning scheduler. The scanning scheduler calculates scanning line reference coordinates on a scanning-line-by-scanning-line basis, based on the scanning condition, and issues a scanning cycle trigger. The programmable sequencer controls supply timing of the scanning line reference coordinates and a scanning position on an in-line pixel-by-pixel basis, based on line scanning procedure information and the scanning cycle trigger provided from the beam scanning scheduler.

9 Claims, 14 Drawing Sheets

CHARGED PARTICLE BEAM DEVICE

RELATED APPLICATIONS

This application is the U.S. National Phase under 35 U.S.C. §371 of International Application No. PCT/JP2011/003553, filed on Jun. 22, 2011, which in turn claims the benefit of Japanese Application No. 2010-168771, filed on Jul. 28, 2010, the disclosures of which Applications are incorporated by reference herein.

TECHNICAL FIELD

The present invention relates to a charged particle beam device which scans a charged particle beams to obtain an electronic image. For example, this applies to an inspection device, measuring device, observation device, scanning electron microscope or scanning ion microscope and the like used for measuring and inspection of a sample such as a semiconductor device, substrate, photomask (light exposure mask) or liquid crystal with a fine pattern.

BACKGROUND ART

In a process of manufacturing a semiconductor element device, in order to detect the generation of abnormality or generation of failure in lithography processing, etching processing and other processing early or in advance, inspection of a pattern on a semiconductor wafer is carried out at the end of each manufacturing process.

With the miniaturization of circuit patterns, the complication of circuit pattern shapes, and the diversification of materials, a method and device for inspecting a pattern using an electron beam image with a higher resolution than an optical image is put into practical use.

In order to carry out high-throughput and highly accurate inspection to catch up with the increase in wafer diameter and the miniaturization of circuit patterns, it is important to acquire a high-SN image at a very high speed.

Patent Document 1 discloses an invention in which, in order to carry out beam canning at a high speed and with high accuracy, scanning deflection control is processed in a divided manner in a high-speed circuit and a low-speed circuit and data transmission and a synchronizing method between the high-speed circuit and the low-speed circuit are contrived, thus enabling high-speed high-accuracy data calculation processing.

Here, since an electronic beam is cast onto an inspection target in order to obtain an electron beam image, the inspection target becomes charged (charged-up). However, depending on charging state, it is difficult in some cases to obtain an image with stable luminance and predetermined inspection accuracy in an inspection with electron beams.

When the charging in the inspection target is generated, there is a problem that the generation efficiency of secondary electrons from the generating part falls or the trajectory of secondary electrons after the generation is affected, thus causing change in brightness/darkness of the image and also causing the image to be distorted without reflecting the actual shape of the circuit pattern.

Moreover, this charging state is sensitive to irradiation conditions of the electron beam. If the irradiation speed or irradiation range of the electron beam is changed, the image ends up with totally different contrast even with respect to the same circuit pattern in the same position.

In the case where a narrowed thin electron beam with small electron beam current is slowly cast onto a sample and signal detection is carried out over a long time, as in the conventional SEM, a signal detected during a detection time per unit pixel is integrated to form an image signal of that unit pixel, in order to obtain a necessary SN ratio for comparative inspection. Since the charging state changes with time depending on irradiation time, as described already, the image signal changes while being integrated, making it difficult to obtain stable contrast. It is necessary to restrain the influence of temporal change due to charging.

FIG. 1 is a view showing the relation between the scanning time and waiting time of an electron beam 19 and the position in X direction. In FIG. 1, a scanning time T1 is considered an irradiation interval between scanning (1) and scanning (2), and a canning time T2 is considered an irradiation interval between scanning (2) and scanning (3). When a scanning time T3 is controlled fixedly, waiting times T4 and T5 for each irradiation are made even by scanning in such a manner that T1 and T2 become the same duration. By thus making the irradiation interval constant, the charging status can be made uniform and the generation of uneven contrast can be restrained.

Also, by making the amount of Y deflection constant, correction processing for focal distortion due to deflection to Y direction, processing of out-of-deflection field determination or the like are no longer necessary, and the simplification of processing improves reliability and processing speed and can contribute to improvement in throughput.

RELATED ART DOCUMENT

Patent Document

Patent Document 1: JP-A-11-161633

SUMMARY OF THE INVENTION

Problems that the Invention is to Solve

In any SEM inspection device or inspection method of the related art, considering the nature of using electron beams, a technique in which the beam scanning method, scanning cycle and the like are adjusted according to inspection target and inspection conditions is employed in order to improve SN, realize stabilization of charging and dosage, and prevent inspection throughput from falling. That is, a beam control technique which strictly manages the beam scanning time and has high scanning flexibility to cope with various beam scanning methods is required.

However, in actually realizing beam control which strictly manages the beam scanning time and has high scanning flexibility to cope with various beam scanning methods, there are problems as follows.

Usually, a technique in which scanning sequences are controlled, using a microprocessor as means for coping with various beam scanning methods, can be considered. However, with a microprocessor, it is easy to prepare various scanning sequences on software but it is difficult to manage the control time strictly. Particularly, since beam scanning is usually controlled on a clock cycle of several nanoseconds, management in each cycle is difficult with a microprocessor in which a dummy cycle exists. Simply managing beam scanning sequences with a microprocessor causes the occurrence of fluctuations in scanning cycle. Fluctuations in scanning cycle impair charging evenness in a scanned site at the time of beam scanning, and also generate jitter in an analog signal which controls beam scanning and lower detection sensitivity. Also, if an expensive processor with high processing capability is used, there is a possibility that the above problems can be solved to a certain extent, but the cost is excessive. Therefore, a technique which enables stabilization of scanning cycle without being affected by the performance of the processor is desired.

Meanwhile, in the case where beam scanning control is carried out in a circuit for the purpose of strictly managing the beam scanning cycle, it is difficult to cope with various beam scanning methods. Preparing a circuit for each beam scanning method can be considered, but the technique is expensive because of increase in size and complexity of the circuit configuration. Also, since an optimum beam scanning method varies depending on inspection target and inspection conditions, it is not realistic to reconstruct a circuit every time a new scanning method is established. Therefore, a processor needs to be used.

In view of the foregoing problems, the invention is to provide a configuration for electron beam scanning control which can carry out management so as to stabilize the beam scanning cycle and can realize various types of beam scanning.

Means for Solving the Problems

A charged particle beam device according to the invention solves the above problems by executing scanning control of the charged particle beam device in a divisional manner into control on a scanning-line-by-scanning-line basis and control for scanning one scanning line precisely. As a configuration to embody the above technical idea of "executing in a divisional manner", the charged particle beam device according to the invention includes beam scanning scheduling means for controlling beam scanning on a scanning-line-by-scanning-line basis, and a programmable sequencer which carries out beam scanning control according to a beam scanning schedule generated by the beam scanning scheduling means. Since the programmable sequencer carries out control of one scanning line, control of one scanning line can be executed much more precisely than in the conventional technique.

Further characteristics of the invention will be clarified by the following best mode for carrying out the invention and the accompanying drawings.

Advantages of the Invention

According to the invention, various scanning sequences which are necessary to improve detection sensitivity by improving SN and eliminating deflection distortion or the like can be changed flexibly according to the inspection conditions, and at the same time, unevenness in scanning cycle which hinders stabilization of charging can be eliminated as much as possible and beam scanning can be realized on a stable scanning cycle.

Also, improvement in customizability and operability can be realized by providing means for visualizing scanning sequences.

MODE FOR CARRYING OUT THE INVENTION

Figure 1:
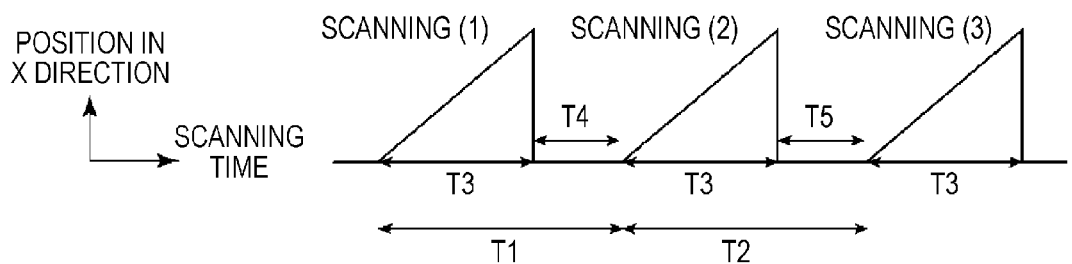
FIG. 1 It is a conceptual view showing stabilization of scanning interval.

Hereinafter, an embodiment of the invention will be described with reference to the accompanying drawings. However, the embodiment is simply an example to realize the invention and it should be noted that the embodiment does not limit the technical scope of the invention. Also, the same configuration parts in the drawings are denoted by the same reference numerals.

First, a common basic configuration in each example will be described. As described above, in an embodiment of the invention, beam scanning control means of a charged particle beam device includes beam scanning scheduling means and a programmable sequencer. The beam scanning scheduling means calculates scanning line reference coordinates on a scanning-line-by-scanning-line basis, based on a scanning condition, and issues a scanning cycle trigger. The programmable sequencer controls supply timing of the scanning line reference coordinates and a scanning position on an in-line pixel-by-pixel basis, based on line scanning procedure information stored in advance in an internal memory and the scanning cycle trigger provided from the beam scanning scheduling means. The line scanning procedure information is control information to control each scanning line on a line-by-line basis and includes, for example, the number of pixels in one line, the number of times line scanning is repeated, pixel pitch, and information of line scanning direction. The number of pixels in one line is equivalent to the number of pixels per line and is used to determine completion of scanning of one line. The number of times line scanning is repeated is equivalent to the number of times line scanning of the same processing content is repeated and is used to determine completion of scanning of plural lines. The pixel pitch is equivalent to the distance between pixels and is used as the amount of displacement of pixel coordinates. The information of line scanning direction is used to determine whether to carry out line scanning in positive direction or negative direction. The information of line scanning direction may be replaced by the positive or negative sign of a pixel pitch value.

The charged particle beam device further includes synchronizing signal output means for supplying a synchronizing signal to a signal detector. This scanning scheduling means generates and supplies a line-by-line synchronizing signal to the synchronizing signal output means, based on the scanning condition. Then, the synchronizing single output means outputs the line-by-line synchronizing signal based on a line update command provided from the programmable sequencer.

Also, the programmable sequencer generates and supplies a pixel-by-pixel synchronizing signal to the synchronizing signal output means, based on a pixel synchronization command included in the line scanning procedure information. Then, the synchronizing signal output means selects and outputs one of the line-by-line synchronizing signal and the pixel-by-pixel synchronizing signal, based on the scanning condition.

The line scanning procedure information includes the number of times line scanning is repeated, pixel pitch, and information of line scanning direction. In this case, the programmable sequencer switches the number of times line scanning is repeated, the pixel pitch and the line scanning direction according to the scanning condition, every scanning sequence.

The charged particle beam device further includes confirmation means for inputting a scanning condition and displaying, on a display screen, a content of a scanning schedule decided based on the scanning condition, thus enabling confirmation, and means for generating a scanning sequence executed based on the scanning schedule, as visual information. Also, the confirmation means displays the generated visual information of the scanning sequence on the display screen.

The charged particle beam device further includes means for rewriting the line scanning procedure information from an upper system. Operation procedure information is switched every scanning condition.

Example 1

Figure 2:
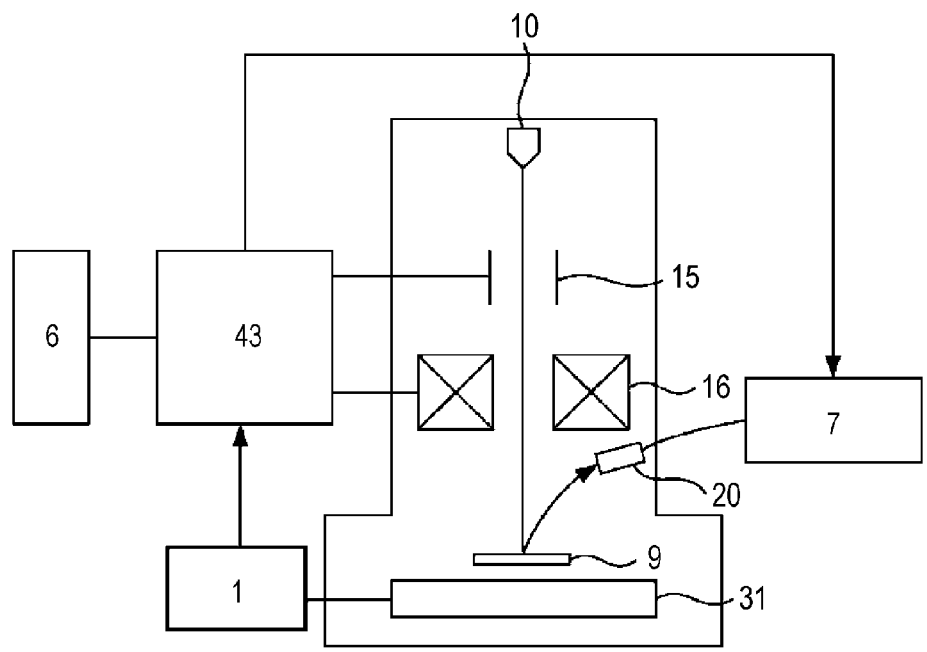
FIG. 2 It is a general view of an embodiment of an inspection device to which the invention is applied.

In this example, an example of an inspection device to which a scanning electron microscope is applied will be described. FIG. 2 is a longitudinal sectional view showing the configuration of the inspection device of this example. This inspection device includes an electron gun 10, an electron beam scanning unit 15, a lens unit 16, a sample 9 which is a detection subject (observation subject), a stage 31, a stage control unit 1, a detection unit 20, an image processing unit 7, a scanning control unit 43, a device control unit 6, and a monitor 50.

In the inspection device shown in FIG. 2, the electron beam scanning unit 15 swings an electron beam generated from the electron gun 10 at an appropriate angle, and the lens unit 16 focuses the electron beam to scan the top of the sample 9 in one direction, for example, in X direction, under appropriate scanning conditions, for example, conditions such as scanning interval, scanning speed, and beam spot diameter. At the stage 31, a line image in X direction obtained by the detection unit 20 and the image processing unit 7 is continuously connected in Y direction while being shifted, for example in Y direction. Thus, X-Y plane image is displayed on the monitor 50.

<Details of Scanning Control Unit>

Next, the scanning control unit 43 will be described in detail using a functional block diagram shown in FIG. 3(a). The scanning control unit 43 is roughly divided into a scanning position calculating unit 118, a scanning control unit 120, a programmable sequencer 109, and a synchronizing signal generating unit 119.

1) Scanning Position Calculating Unit

First, the scanning position calculating unit 118 will be described. The scanning position calculating unit 118 receives, from the stage 31, position information (X, Y coordinates) of the stage where the sample is mounted, and calculates and outputs an amount of deflection 213 which is a control signal to the electron beam scanning unit 15, based on the position information 200.

The scanning position calculating unit 118 receives scanning line reference coordinates 203 which is a reference position of a line scanned by the scanning control unit 120, described below, and calculates a residual displacement 202 which is the amount of difference between the position information 200 and the scanning line reference coordinates 203. The residual displacement 202 is a reference deflection amount indicating how much the electron beam needs to be deflected in order to scan the reference coordinates of a target scanning line with respect to the stage position. The scanning line reference coordinates 203 usually indicate the center coordinates of the scanning line but may be an end of the scanning line or arbitrary coordinates (at each pixel pitch) on the scanning line.

The scanning position calculating unit 118 calculates an amount of deflection 213 based on the residual displacement (amount of shift) 202, which is the reference deflection amount of the target scanning line, in consideration of pixel coordinates 212 indicating which pixel is to be scanned in the target scanning line. That is, the scanning position calculating unit 118 converts the residual displacement (amount of shift) to pixels and thus calculates the amount of deflection to control the scanning position of the electron beam. Meanwhile, the pixel coordinates 212 are generated by the programmable sequencer 109 and a pixel coordinates generating unit 113, described later. For example, if pixel coordinates are incremented within a range of −512 to +511, a line with a length of 1024 pixels can be scanned around the reference coordinates 203 of the scanning line as the center.

2) Scanning Line Control Unit (Beam Scanning Scheduling Means)

Next, the scanning control unit 120 will be described. The scanning control unit 120 is beam scanning scheduling means in this example. The scanning control unit 120 is a section which controls the above scanning position calculating unit 118, and the synchronizing signal generating unit 119 and the programmable sequencer 109, described later, (for example, the reference coordinates 203 of the scanning line are sequentially transmitted to the scanning position calculating unit 118, thus reporting a schedule of electron beam scanning). More specifically, the scanning control unit 120 calculates the scanning line reference coordinates 203 on a line-by-line basis (or on a combination basis of plural lines), generates a line-by-line synchronizing signal 214, and adjusts the scanning cycle of the electron beam 19. Also, the scanning control unit 120 receives information (parameter) about what kind of schedule (electron beam scanning condition 231) should be followed to execute the scanning of the electron beam, from the device control unit (host computer) 6, in order to execute various controls. Here, the scanning cycle is the sum of one cycle of scanning deflection signal waveform and waiting time between waveforms during which electron beam irradiation is not carried out. For example, in the case of the deflection signal with a saw-toothed waveform shown in FIG. 1, the scanning cycle is T1=T3+T4 or T2=T3+T5 or the like.

The scanning control unit 120 calculates the scanning line reference coordinates 203 on a scanning-line-by-scanning-line basis, based on the electron beam scanning condition 231 designated by the device control unit 6 (converts the parameter acquired from the device control unit 6 to coordinate information). The scanning line reference coordinates 203 are stored in a FIFO (First In First Out) memory and transmitted to the scanning position calculating unit 118 in storing order every a line update command 215 is issued from the programmable sequencer 109, described later. Although not shown in FIG. 3(a), the FIFO memory is provided in an FPGA.

The scanning control unit 120 carries out management and adjustment of the scanning cycle and issues a cycle trigger 207 designating the start of scanning to the programmable sequencer 109, described later, according to the scanning cycle. The programmable sequencer 109 controls the inspection device to start line scanning in the timing when this cycle trigger 207 is issued. Normally, a hardware timer (not shown) is used for the management and adjustment of the scanning cycle. The hardware timer can continuously issue a cycle trigger of an accurate cycle unless a set scanning cycle 206 from the scanning control unit 120 is changed. Thus, the line scanning is carried out very accurately on a predetermined cycle.

The scanning control unit 120 monitors the residual displacement 202 and adjusts the scanning cycle based on the progress of the residual displacement 202. For example, if the residual displacement 202 updated every line scanning expands, is means that the scanning cycle is slow in relation to the moving speed of the stage. If the scanning cycle is left unchanged, an amount of deflection 218 of the electron beam 19 increases excessively and exceeds the deflectable range of the electron beam 19. Therefore, the scanning cycle is adjusted to be shorter. However, if the scanning cycle is suddenly changed, the irradiation time of the electron beam 19 onto the inspection subject sample 9 changes, thus generating unevenness in the charging state and making it difficult to achieve stable contrast. Therefore, the scanning control unit 120 carries out follow-up control so that the range of change in the scanning cycle does not exceed a predetermined threshold value.

A branch flag 209 is a flag indicating which position the electron beam should be moved to in order to scan the next scanning range after scanning a certain scanning range based on the electron beam scanning condition 231. This branch flag 209 is means for changing the scanning sequence procedure from the programmable sequencer 109, described later, based on an instruction from the scanning control unit 120. Similarly to the above scanning line reference coordinates 203, the branch flag 209, too, is stored in the FIFO memory structure and transmitted to the programmable sequencer 109 in storing order every time the line update command 215 is issued from the programmable sequencer 109, described later. Thus, the scanning sequence procedure can be changed every scanning line. For example, when the scanning direction is to be switched every line alternately between forward direction and backward direction, the scanning direction is stored for every line as the branch flag 209 into the FIFO memory according to the scheduling, that is, in processing order, thus enabling alternate switching of the scanning direction.

Moreover, the scanning control unit 120 generates the line-by-line synchronizing signal 214, which is a synchronizing signal 53 and a blanking signal 54 on a scanning-line-by-scanning-line basis. The synchronizing signal 53 is means for linking secondary electron detection timing in the image processing unit 7 and the timing of scanning of the electron beam 19, as a result of the scanning of the electron beam 19. The line-by-line synchronizing signal 214 is stored in the FIFO memory structure, similarly to the scanning line reference coordinates 203, and transmitted to the synchronizing signal generating unit 119 in storing order every time the line update command 215 is issued from the programmable sequencer 109, described later. The synchronizing signal 53 in a vertical direction of the scanning is called V-Valid signal, and the synchronizing signal 53 in a horizontal direction is called H-Valid signal. Also, the blanking signal 54 is means for controlling the blanking by the electron beam scanning unit 15.

In this way, the scanning control unit 120 needs to control each part in the scanning control unit 43 in a complex manner based on the electron beam scanning condition 231 from the device control unit 6, and may preferably be formed by a microprocessor. However, as in this example, by scheduling in advance the coordinates of a line to be scanned, it is possible to leave the subsequent line scanning to the programmable sequencer 109. Thus, since the scanning control processor is released from control on a line scanning cycle which is shorter than the control cycle of the processor, the processing burden is smaller than when control is carried out every line. This leads to avoiding disturbance of the scanning cycle due to the generation of a dummy cycle, which is a characteristic proper to the processor, in addition to advantages of being able to use a small-size low-speed processor in terms of cost and power saving.

3) Programmable Sequencer

Next, the programmable sequencer 109 will be described. The programmable sequencer 109 carries out various controls of the pixel coordinates changing within one scanning line, the synchronizing signals and the like on a scanning-line-by-scanning-line basis (or on a combination basis of plural scanning lines), based on the scanning cycle adjusted by the scanning control unit 120. The programmable sequencer 109 is accompanied by an instruction memory 117 and the pixel coordinates generating unit 113.

The programmable sequencer 109 sequentially reads out a micro program which is a combination of micro commands (test patterns) stored in the instruction memory 117 and controls the timing of line update command 215 which triggers update of the scanning line reference coordinates 203 and the line-by-line synchronizing signal 214 by the scanning control unit 120, a cycle update command 211 which prompts adjustment of the scanning cycle managed by the scanning control unit 120, a pixel coordinates command 219 which designates pixel coordinates of the scanning target to the pixel coordinates generating unit 113, described later, and a pixel-by-pixel synchronizing signal 216, in accordance with the micro commands.

Typical micro commands are program control commands such as a program control command to generate a read-out address of the next micro program and a repetition command to realize repetitive processing like a loop, as well as each functional block control command such as the line update command 215. With the program control commands, the programmable sequencer 109 can execute various programs such as condition branching based on the branch flag 209 and repetition loops.

Also, since the programmable sequencer 109 specializes in electron beam scanning control and can be formed by a simpler command execution circuit than a general-purpose processor, an operation at several hundred MHz is possible with an inexpensive FPGA (Field Programmable Gate Array). Moreover, a micro command is made up of plural bit fields corresponding to the type of the command and is processed in a functional block corresponding to each bit field. Therefore, micro commands can be executed in parallel if these commands are directed to different functional blocks. With the programmable sequencer 109, high-speed scanning control on each clock cycle can be realized inexpensively.

The instruction memory 117 is a memory block which stores micro programs. Normally, by storing plural patterns of micro program and selecting a micro program to be executed in accordance with the electron beam scanning condition 231, it is possible to switch to scanning control corresponding to the scanning condition. Moreover, the instruction memory 117 is configured to be rewritable by the device control unit 6. The micro program can be rewritten according to the electron beam scanning condition 231 which is newly proposed.

The pixel coordinates generating unit 113 is means for calculating the coordinates of a pixel irradiated with the electron beam 19, as local coordinates in the scanning line. Calculation conditions are determined according to the pixel coordinates command 219 read out from the instruction memory 117. The pixel coordinates generating unit 113 has several register files and can be used as an operand of the pixel coordinates command 219. The pixel coordinates command 219 includes the loading of a value from a register file, addition processing between register files and the like, and therefore pixel width and line width can be switched according to the scanning condition without rewriting the instruction memory 117.

The programmable sequencer 109 controls the pixel-by-pixel synchronizing signal 216 shifting within the scanning line and thereby enables control of the synchronizing signal 53 and the blanking signal 54 with higher accuracy on a pixel-by-pixel basis. Since the scanning control unit 120 does not control which pixel is irradiated with the electron beam, this pixel-by-pixel synchronizing signal 216 is needed when synchronization on a pixel-by-pixel basis is demanded. By the way, whether to achieve synchronization on a line-by-line basis or on a pixel-by-pixel basis is provided by the device control unit 6. Also, the pixel-by-pixel synchronizing signal 216 is generated based on a micro program (test pattern).

4) Synchronizing Signal Generating Unit

Next, the synchronizing signal generating unit 119 will be described. The synchronizing signal generating unit 119 is means for selecting the line-by-line synchronizing signal 214 generated by the scanning control unit 120 and the pixel-by-pixel synchronizing signal 216 generated by the programmable sequencer 109.

Normally, the synchronizing signal 53 and the blanking signal 54 are controlled by the pixel-by-pixel synchronizing signal 216. However, when the synchronizing signal needs to be controlled every line as in pre-charge scan or dummy scan, the synchronizing signal 53 and the blanking signal 54 are controlled by the line-by-line synchronizing signal 214. By thus dividing the control of the synchronizing signal 53 and the blanking signal 54 for each line and for each pixel, it is possible to control the synchronizing signal with high accuracy and to change the scanning target on the scanning line without changing the basic scanning procedure.

Figure 3:
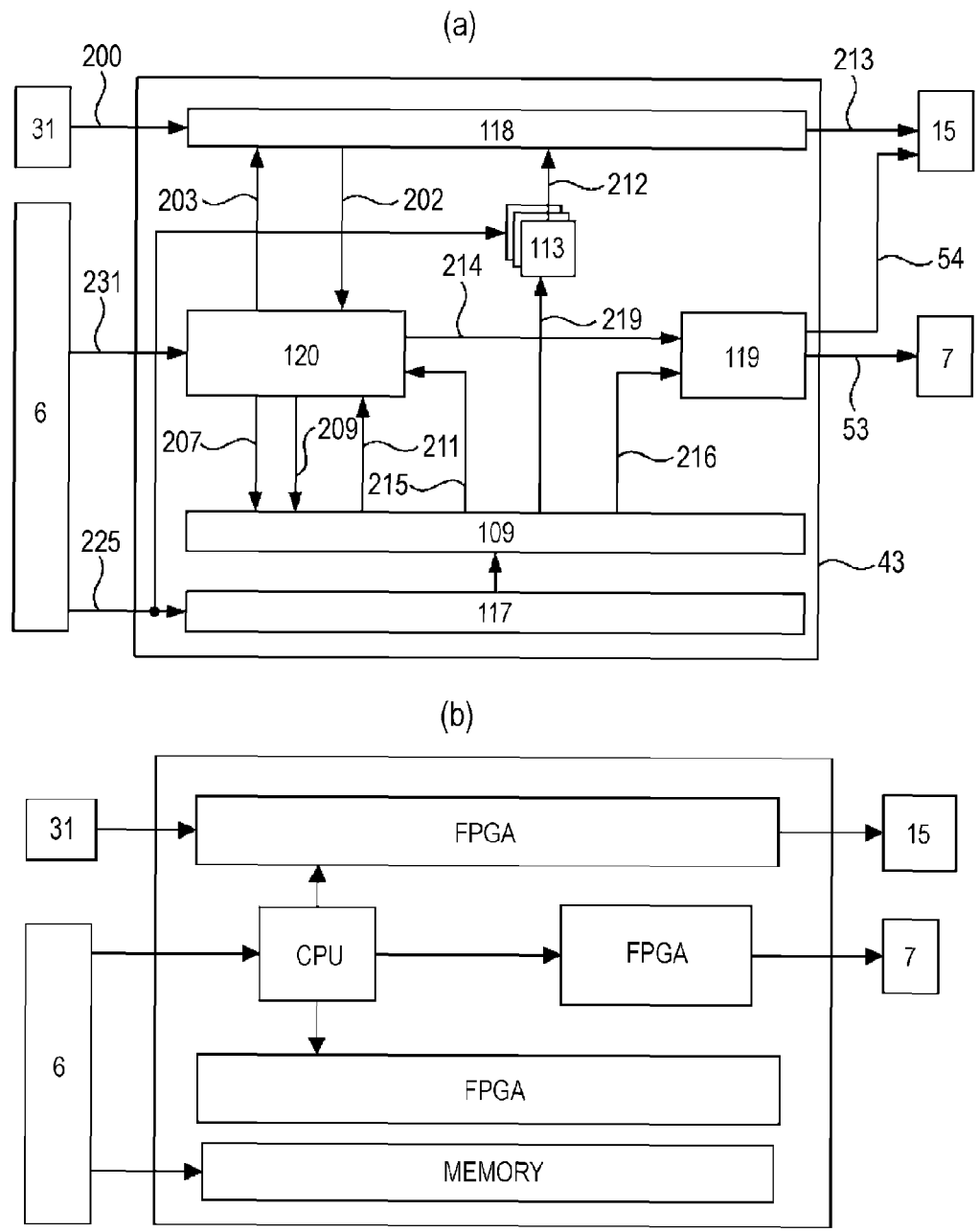
FIG. 3 It is a view showing a schematic configuration of a scanning control unit.

Up to this point, the configuration view of hardware corresponding to the functional block diagram of the scanning control unit 43 described using FIG. 3(*a*) is shown in FIG. 3(*b*). The scanning position calculating unit 118, the pixel coordinates generating unit 113, the synchronizing signal generating unit 119 and the programmable sequencer 109 are formed by FPGAs, and the instruction memory 117 and the scanning control unit 120 are formed by a memory and a CPU, respectively. In practice, the CPU and the memory are often incorporated in the FPGA. Also, the three FPGAs are often realized by a single FPGA.

<Specific Example of Scanning Control>

The overall configuration of the inspection device according to this example and the configuration of the scanning control unit 43 are described above. Hereinafter, as a specific example of scanning control executed by the scanning control unit 43, raster scan and variable-interval scanning as a modification thereof will be described. Also, in FIGS. 4 to 15 referred to hereinafter, a solid line with arrow indicates the beam traveling direction at the time of scanning, and a broken line with arrow indicates the beam traveling direction at the time of pre-charge or discharge. Here, "discharge" by electron beam irradiation refers to neutralizing positive charge by electron beam (charge: negative) irradiation when an inspection subject sample is charged positively. On the other hand, "pre-charge" by electron beam irradiation refers to creating a negatively charged state or intensifying negative charge by electron beam (charge: negative) irradiation when the charging of an inspection subject sample is zero or negative.

Figure 4:
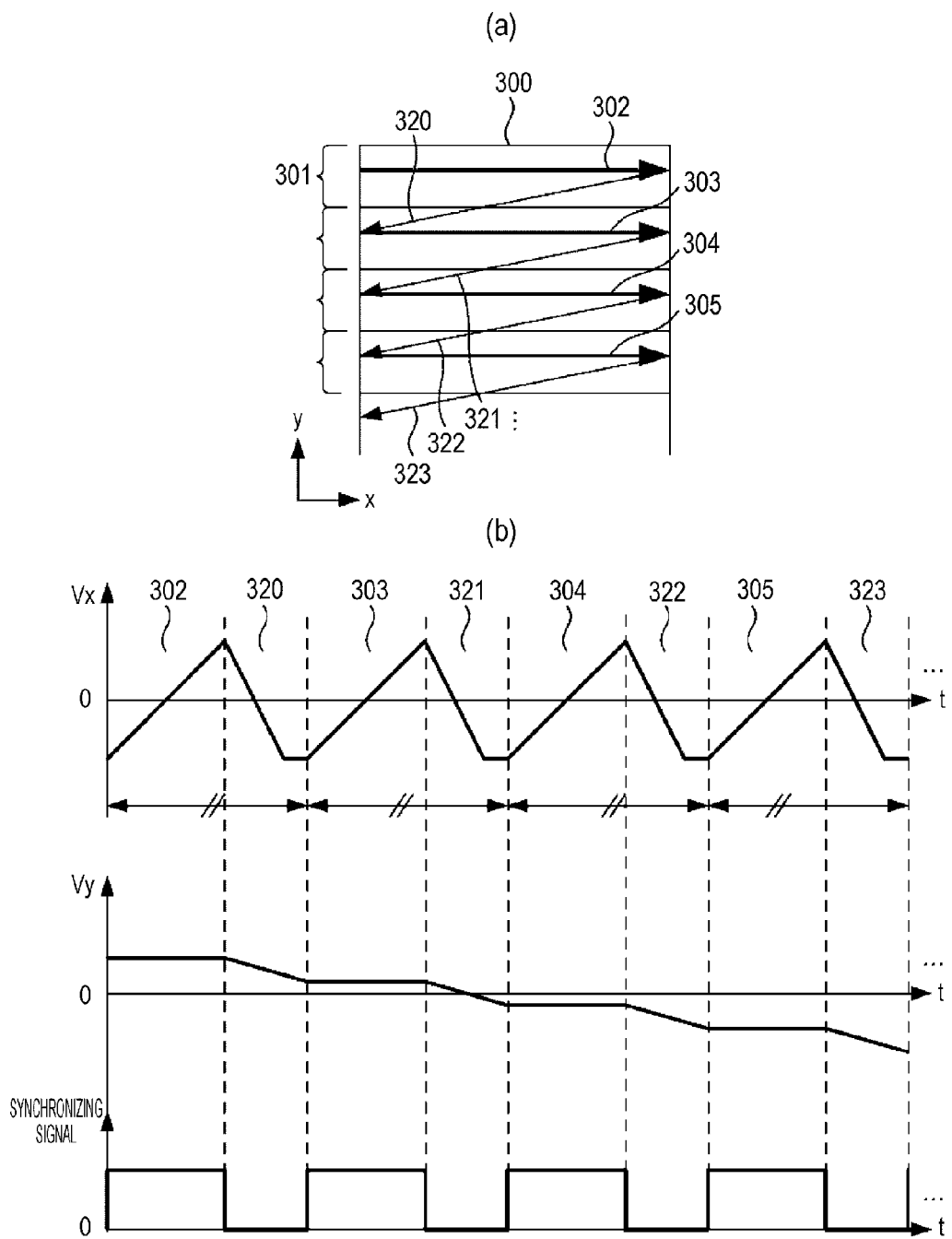
FIG. 4 It is a view showing an electron beam scanning operation in basic scanning.

FIG. 4 is a view showing a first embodiment of an operation of the inspection device according to this example. FIG. 4(*a*) shows how inspection stripes 300 are scanned in a predetermined direction (forward direction) in order from the top at each line pitch 301. FIG. 4(*b*) shows transition of deflection voltages Vx, Vy of the electron beam scanning unit 15 and the synchronizing signal to the image processing unit 7 or the electron beam scanning unit 15 at the time of scanning (in this case, it is assumed that the electron beam scanning unit 15 is an electrostatic deflection type).

Here, the voltages Vx, Vy in FIG. 4(*b*) shows changes in deflection voltage in x and y directions applied to the electron beam scanning unit 15 in the case where the sample stage is not moved. However, the sample stage may be moved in y direction with Vy kept constant (the same applies to Vy in FIGS. 5 to 15).

Also, a configuration in which scanning (moving) in y direction is not carried out (Vy is kept constant) while the electron beam 19 is scanned in x direction (during the period of a ramp waveform where Vx rises to the right and falls to the right), is described here. However, the embodiment is not limited to this configuration. For example, a configuration in which the electron beam 19 is scanned in ±x directions while the sample stage is moved in y direction may be employed (the same applies to embodiments described below).

Figure 7:
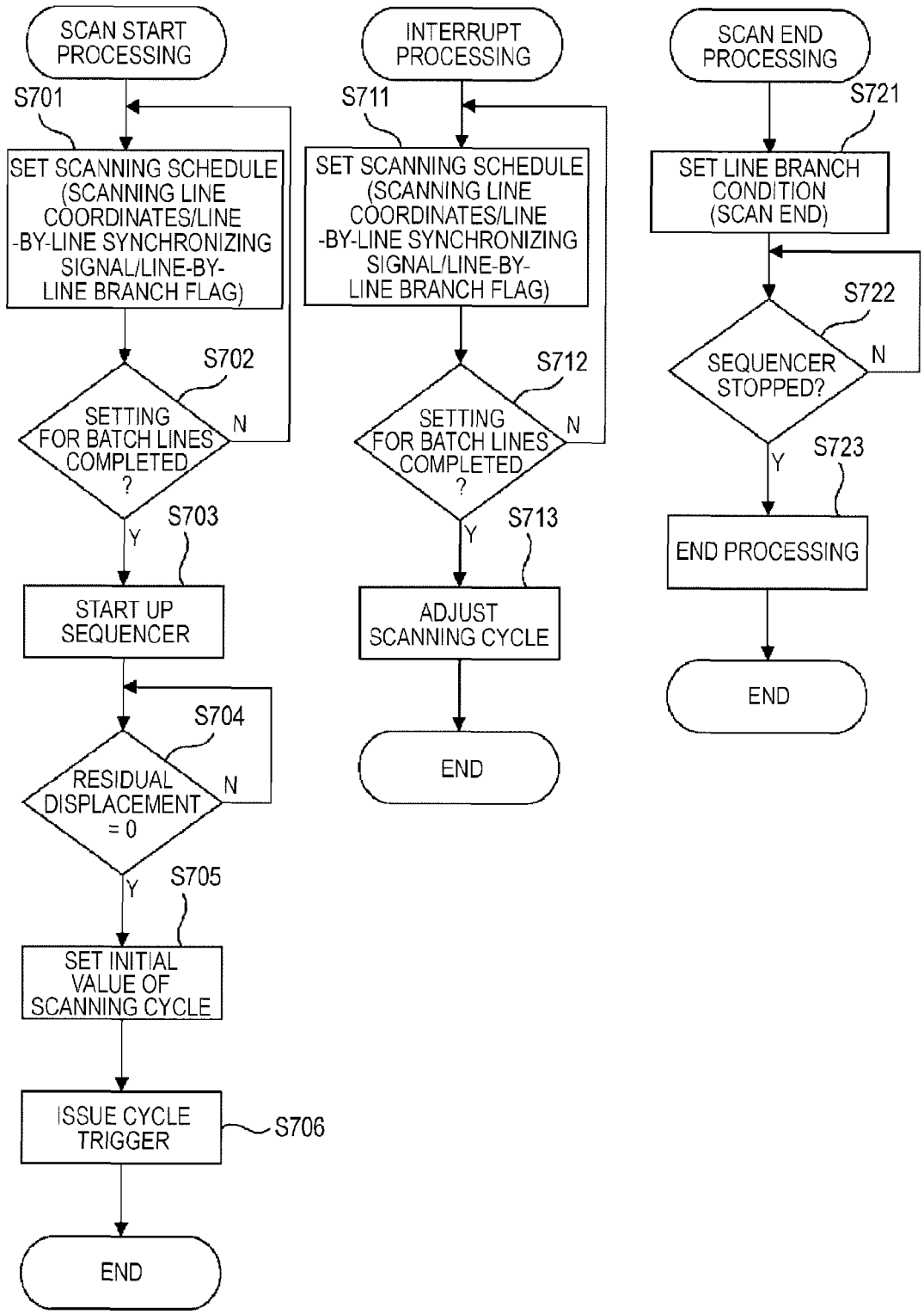
FIG. 7 It is a view showing an operation flow of a scan control processor in basic scanning and variable-interval scanning.
Figure 8:
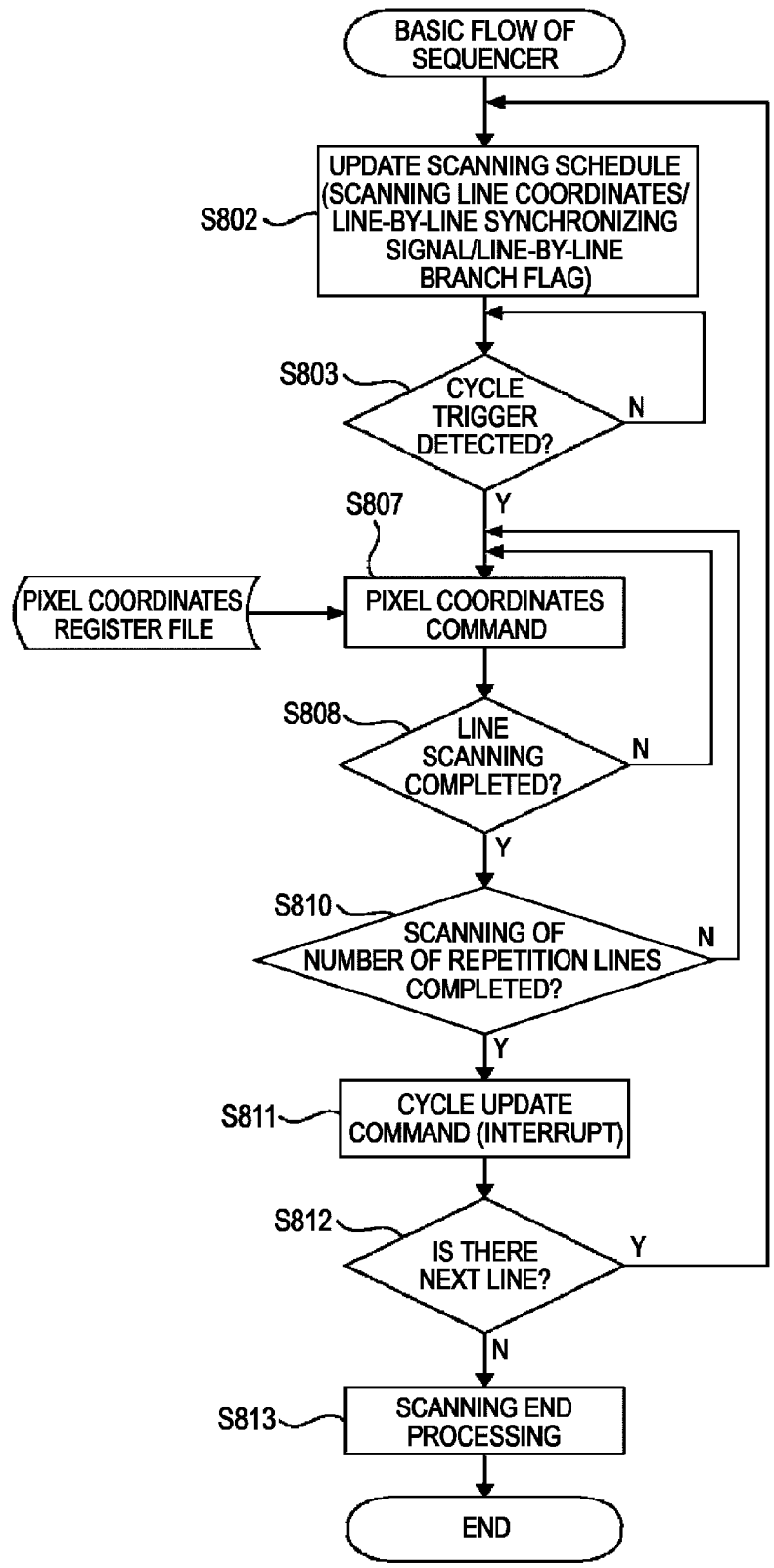
FIG. 8 It is a view showing a flowchart for explaining an operation of a programmable sequencer in basic scanning and variable-interval scanning.

FIGS. 7 and 8 are flowcharts for explaining the operation of the scanning control unit 43 to realize the scanning method described in FIG. 4. FIG. 7 shows an operation flow of the scanning control unit 120. FIG. 8 shows an operation flow of the programmable sequencer 109.

The flow of the scanning control processor shown in FIG. 7 includes three kinds of processing, that is, scan (scanning) start processing, interrupt processing, and scan end processing.

When the start of scanning is designated by the device control unit 6, based on the scanning condition 231 (parameter) acquired from the device control unit 6, the scanning control unit 120 calculates the scanning line reference coordinates 203 within the inspection stripes 300 using the scanning condition 231 (step S701). At the same time, the scanning control unit 120 generates the line-by-line synchronizing signal 214, which is a synchronizing signal shifting every line (step S701). The processing of step S701 is continued until the scheduling for batch lines is completed (step S702).

After that, as the scanning control unit 120 reports the completion of the scanning schedule, the programmable sequencer 109 is started up (step S703) and deflection control on one scanning line shown in FIG. 8, described later, is started. The subsequent flow of FIG. 7 and the flow of FIG. 8 are executed in parallel. Also, the scanning control unit 120 monitors the residual displacement 202 in order to determine whether or not the first scanning line reaches a position where scanning is possible, by the movement of the stage (step S704).

When the residual displacement 202 becomes zero and the scanning of the first line becomes possible (YES in step S704), the scanning control unit 120 sets the scanning cycle of the subsequent lines on the timer (step S705). After that, the scanning control unit 120 starts up the timer and forcedly issues the cycle trigger 207 at the same time, and notifies the programmable sequencer 109 of the arrival of the first scanning line (step S706). Here, the arrival of the first scanning line is assumed when the residual displacement becomes zero, that is, when the stage coordinates reach target scanning line coordinates. However, since this inspection device is capable of scanning in y direction, it is also possible to provide a threshold value of the residual displacement and start scanning before the stage coordinates reach the target scanning line coordinates.

After the scan (scanning) start processing, the scanning control unit 120 supplements the information of the scanning line reference coordinates 203 and the line-by-line synchronizing signal 214 every time an interrupt (line update command 215) is applied from the programmable sequencer 109 (step S711). The processing of step S711 is continued until the scheduling corresponding to batch lines is completed (step S712). The reason for needing such information supplementation (interrupt) processing is because the number of scanning lines that can be stored in each storage unit is generally smaller than the number of scanning lines of inspection stripes because of the limitation of hardware resources. If all the information can be set with respect to an intended scanning range in steps S701 and S702, the interrupt processing is not necessary.

In addition, the scanning control unit 120 also carries out correction of the line scanning cycle at the same time (step S713). The line scanning cycle after the issue of the forced cycle trigger 207 is issued strictly cyclically by a hardware timer. Thus, unevenness in the charging state due to electron beam scanning time, which causes uneven detection contrast, can be reduced as much as possible.

Figure 5:
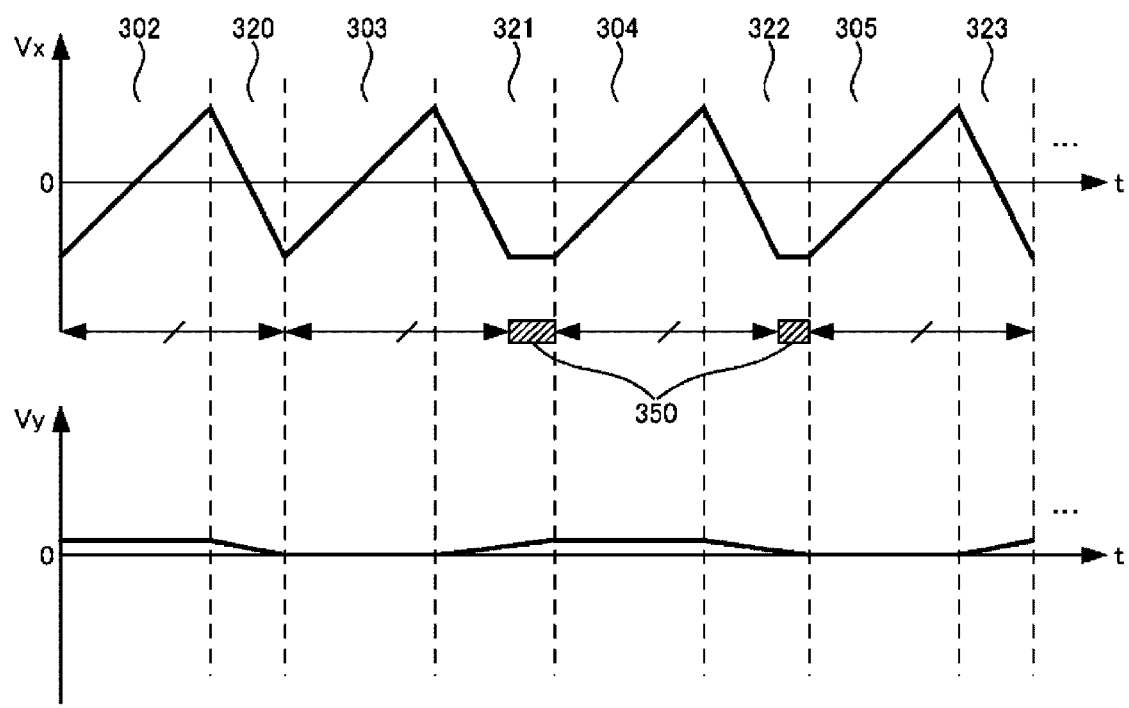
FIG. 5 It is a view showing how an electron beam application time changes because of uneven scanning cycle.
Figure 6:
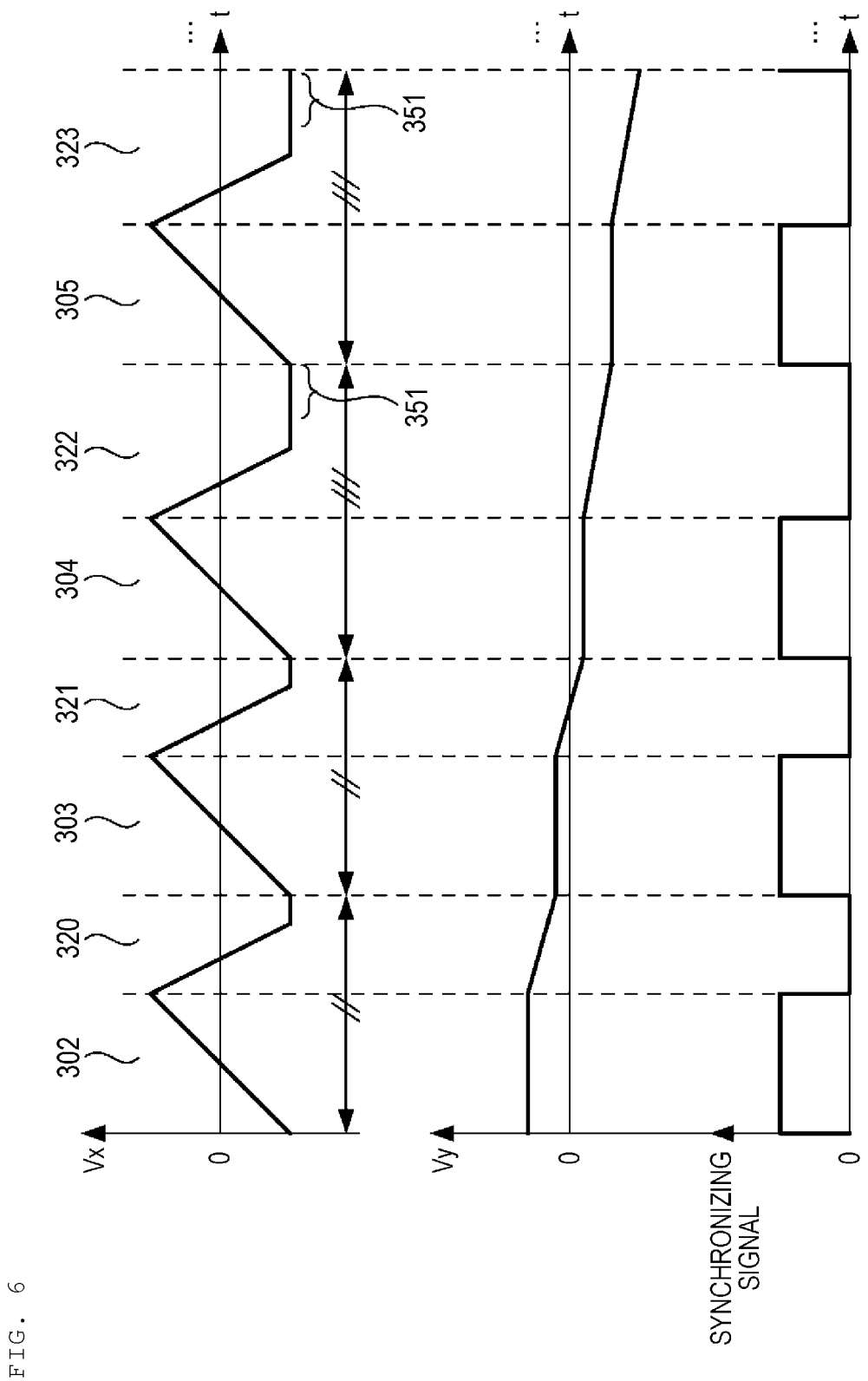
FIG. 6 It is a view showing a scanning operation in the case where a line scanning cycle is variable in variable-interval scanning.

FIG. 5 shows how the application time of the electron beam changes because of unevenness in the scanning cycle according to the conventional method. In this example, the scanning cycle is basically managed on a predetermined cycle by the hardware timer. However, in practice, there can be cases where the line scanning cycle should be variable, such as the case where the moving speed of the stage varies and the position of the stage moves out of the range where scanning is possible, or the case where the scanning cycle is intentionally changed for a certain period as shown in FIG. 6.

Thus, the inspection device of this example has means for correcting the line scanning cycle in the interrupt processing of the scanning control unit 120. Therefore, the line scanning cycle can also be changed every predetermined number of lines.

By thus reserving processing procedures on a line-by-line basis, the processing of the subsequent line scanning can be left to the programmable sequencer 109. That is, the scanning control unit 120 does not need control on a line scanning cycle basis, which is a relatively short cycle as a control cycle of a processor, and therefore does not need a high-performance processor. This is advantageous in terms of cost because of reduction in circuit scale or the like, and also advantageous in terms of radiation noise because the processor need not be operated on a high-speed clock. Also, since the scanning cycle does not depend on the performance of the processor, shortening of the scanning cycle is relatively easy and there also is an effect of restraining unevenness in the scanning cycle due to a dummy cycle of the processor.

Meanwhile, when ending the scanning, the scanning control unit 120 instructs the programmable sequencer 109 to stop the scanning (step S721) and waits until the programmable sequencer 109 stops (step S722). When the programmable sequencer 109 is stopped, the scanning control unit 120 executes end processing (step S723). The end processing includes, for example, control to reset the scanning line reference coordinates 203 and the line-by-line synchronizing signal 214, or the like.

FIG. 8 is a flowchart for explaining the operation of the programmable sequencer 109. In the instruction memory 117, a micro program to realize the processing of the flowchart is downloaded in advance from the device control unit 6 before the scanning starts. The instruction memory 117 has a rewritable configuration and can be modified at any time according to changes in the operation flow. Thus, various scanning methods can be realized and changed online.

The programmable sequencer 109 updates the next scanning line reference coordinates 203 stored as scanning line reservation information by the scanning control unit 120, the line-by-line synchronizing signal 214 and the branch flag 209 in accordance with the line update command 215 (step S802). In this way, unlike an assembler of a processor, the programmable sequencer 109 is configured to be able to execute individual commands in parallel according to need. Therefore, the programmable sequencer 109 can control hardware resources in real time without any dummy cycle and can prevent insertion of a waiting time which is unnecessary for scanning and also manage the scanning cycle strictly.

When the programmable sequencer 109 detects a cycle trigger 207 (step S803), actual scanning processing is carried out using that cycle trigger 207 as a reference point. In the scanning processing of this embodiment, first, the pixel coordinates command 219 is interpreted by the pixel coordinates generating unit 113 and the pixel coordinates 212 within the scanning line are generated one after another (step S807). The pixel coordinates 212 are referred to by the scanning position calculating unit 118 and the amount of deflection 213 to decide the scanning coordinates of each scanning pixel is calculated. The pixel coordinates generating unit 113 has register files to store plural pieces of pixel pitch information. When pixel pitch information is loaded from an arbitrary register file in accordance with the pixel coordinates command 219 and then the pixel coordinates command 219 is executed, pixel coordinates are calculated from the loaded pixel pitch information. In the example of FIG. 4(a), pixel coordinates are calculated at each pixel pitch from the left end toward the right end of each forward scanning 302, 303, 304 and 305. The pixel pitch information stored in the register files can be arbitrarily rewritten at the time of rewriting the instruction memory 117 and is configured in such a way that the designation of a reference target from the plural register files can be selected as an argument in the pixel coordinates command 219, which is a micro command. Therefore, scanning at an arbitrary pixel pitch can be carried out according to the scanning condition 231. Also, as will be described in detail later, not only forward scanning but also backward scanning can easily be carried out depending on the way of providing pixel pitch information of the register files. Then, such line scanning is executed and the programmable sequencer 109 determines whether scanning of one line is completed or not (step S808). If the scanning is not completed, the scanning is continued. If the scanning is completed, the processing shifts to step S810.

In step S810, whether scanning of a scheduled number of lines is completed or not is determined using a repetition command. This is for the purpose of prompting the scanning control unit 120 to update the subsequent scanning line schedule. If scanning of the number of lines corresponding to the number of repetitions designated by the repetition command is completed (YES in step S810), a cycle update command 211 is applied to the scanning control unit 120 (step S811).

Subsequently, the programmable sequencer 109 determines whether there is a next line to be scanned or not (step S812). If there is another line to be scanned, the scanning control unit 120 receiving the cycle update command 211 (interrupt request) supplements the scanning line reference coordinates 203 and the line-by-line synchronizing signal 214 and adjusts the scanning cycle. If there is no line to be scanned, the programmable sequencer 109 carries out end processing of the scanning (step S813).

By the way, in this embodiment, the scanning control unit 120 corrects the scanning cycle within interrupt processing in order to cope with cases where intentional correction of the scanning cycle is desired for stabilization of the system and for experimental purposes, as described above. The number of repetitions here is equivalent to the line number interval in the correction of the scanning cycle. By thus periodically correcting the scanning cycle, it is possible to maintain stability of the scanning cycle and the charging state, prevent system errors in advance such as the stage moving out of the range where scanning is possible, and construct a highly reliable system.

In this specific example, an example of forward scanning, which is a basic pattern of scanning, is described above. As described above, in this embodiment, the programmable sequencer 109 carries out high-speed line scanning according to the micro program stored in the instruction memory 117. That is, by rewriting the micro program in the instruction memory 117, various scanning sequences can be realized.

Example 2

In this example, as an example of a scanning sequence that can be realized by rewriting the micro program, swing-back scanning and swing-back pre-charge scanning will be described. The overall configuration of the device is similar to FIG. 2 and FIG. 3(a), (b) described in Example 1 and therefore further explanation will be omitted.

Figure 9:
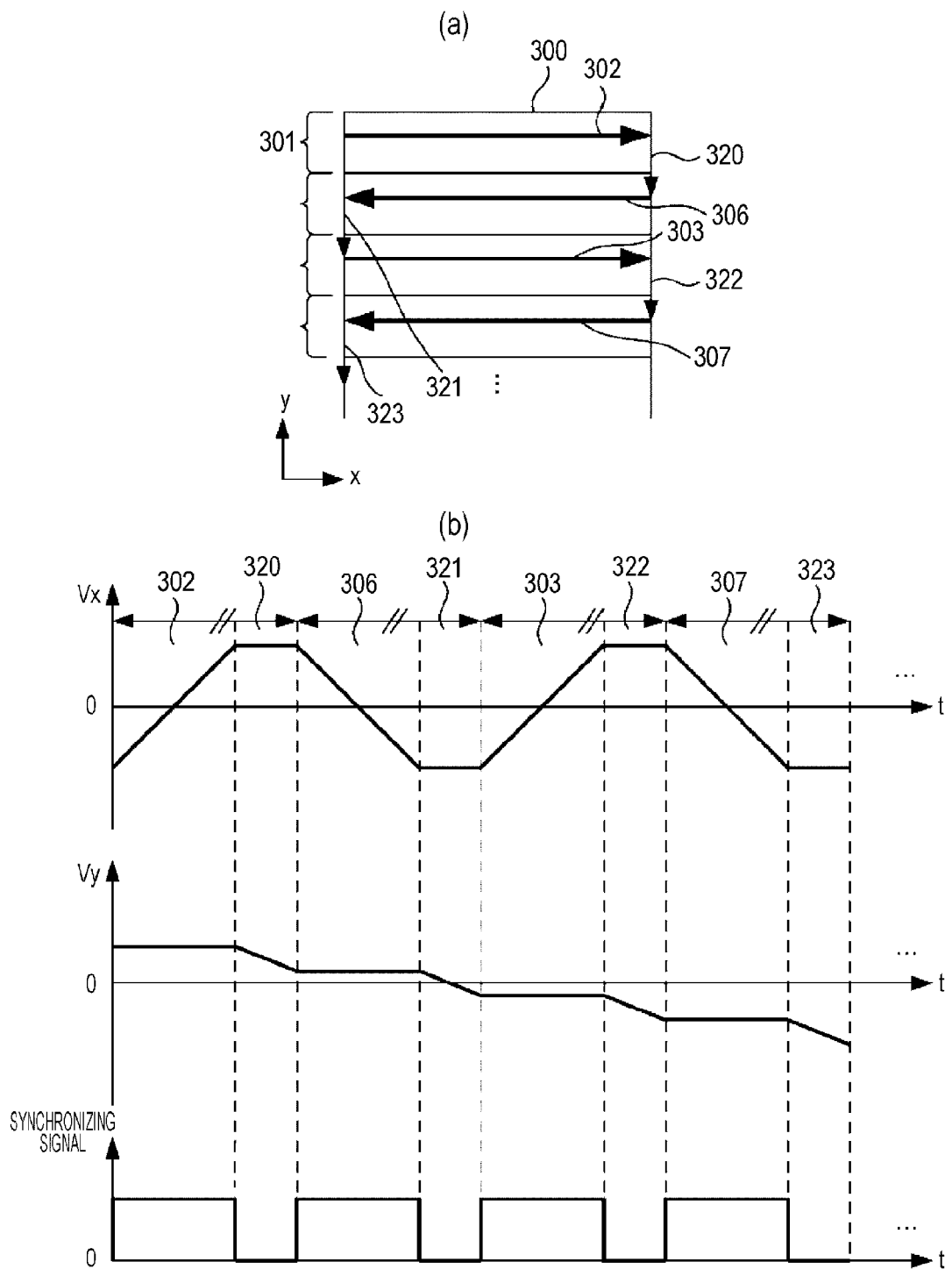
FIG. 9 It is a view showing an electron beam scanning operation in swing-back scanning and swing-back pre-charge scanning.
Figure 10:
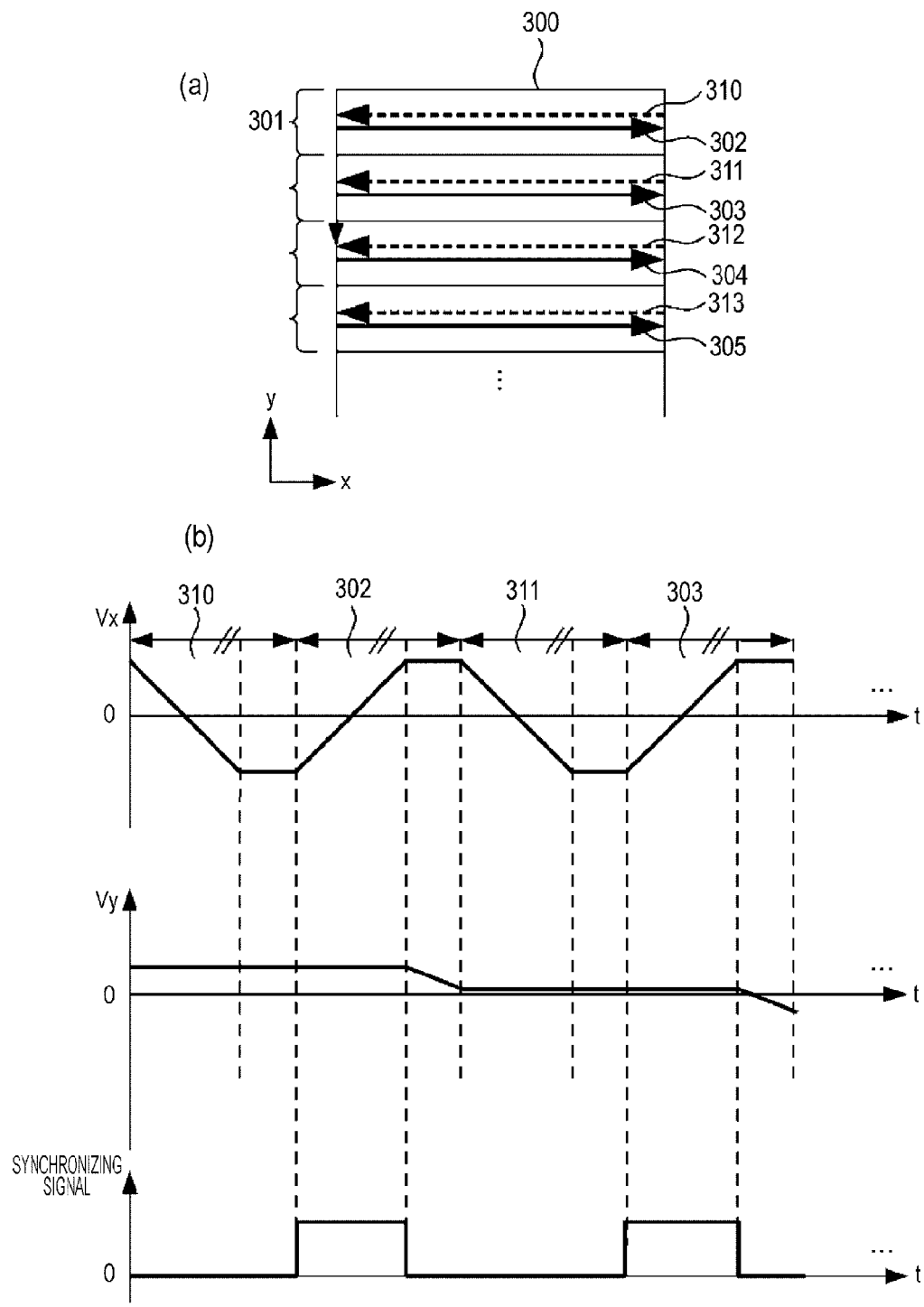
FIG. 10 It is a view showing an electron beam scanning operation in which backward scanning is pre-charge scanning in swing-back scanning and swing-back pre-charge scanning.
Figure 11:
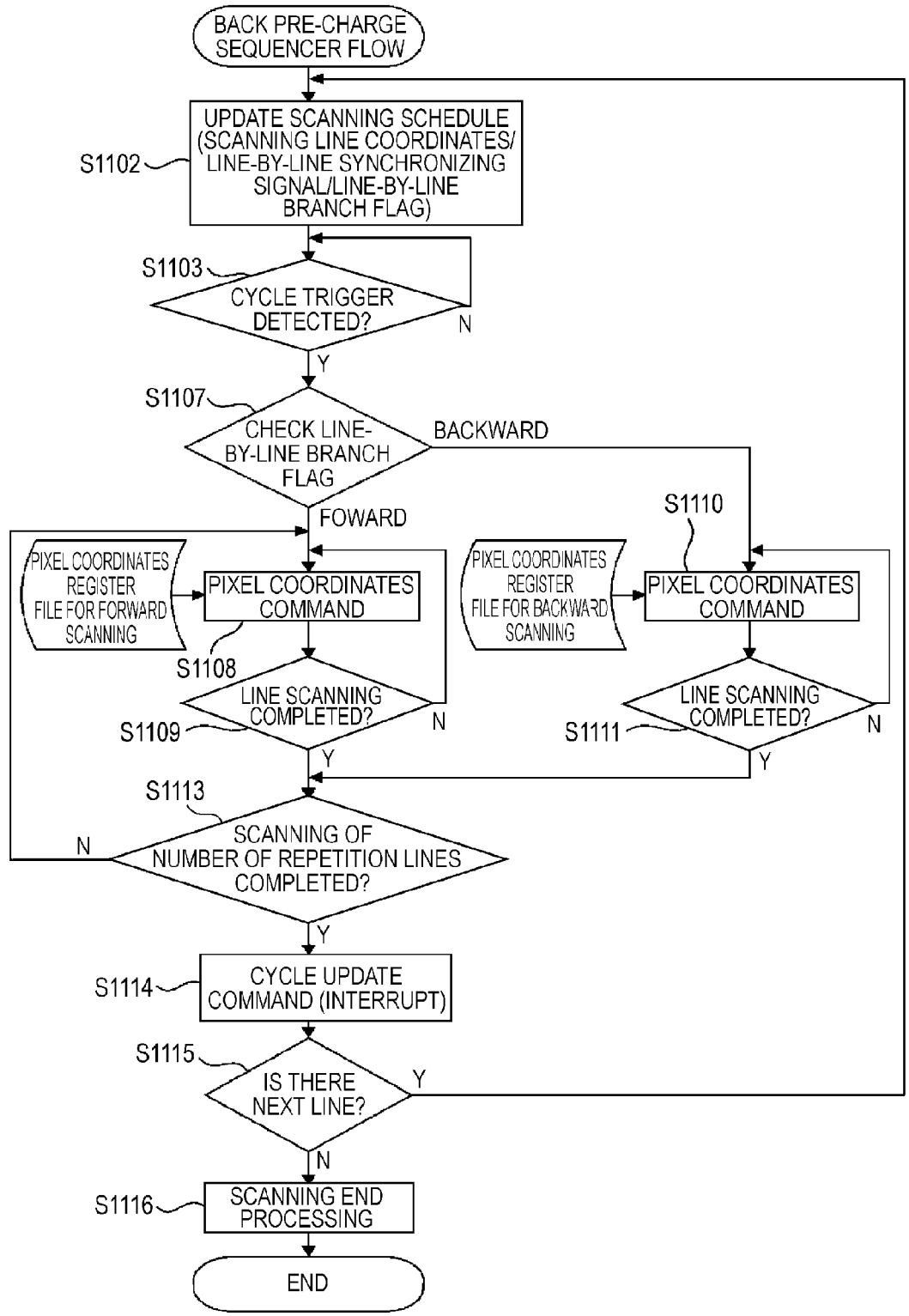
FIG. 11 It is a flowchart for explaining an operation of a programmable sequencer in swing-back scanning and swing-back pre-charge scanning.

FIGS. 9, 10 and 11 are views for explaining an example of swing-back scanning and swing-back pre-charge scanning. FIG. 9(a) is an example of a scanning sequence to carry out forward scanning and backward scanning alternately. Scanning not only forward but also backward in this manner is highly effective in improvement in inspection throughput. FIG. 9(b) shows transition of the deflection voltages Vx, Vy of the scanning deflector and the synchronizing signal to the image processing unit 7 or the electron beam scanning unit 15 at the time of forward and backward scanning. Differences from FIG. 4(b) are that the scanning cycle is strictly managed also at the time of backward scanning since the backward direction is also used for scanning, and that a synchronizing signal is generated also at the time of backward scanning.

FIG. 10(a) is an example in which backward scanning is utilized for pre-charge scan. Carrying out pre-charge scan before actual scanning is very effective in view of stabilization of charging ability. Moreover, by using backward scanning for pre-charge scan, reduction in throughput can be restrained as much as possible. FIG. 10(b) shows transition of the deflection voltages Vx, Vy of the electron beam scanning unit 15 or the synchronizing signal to the image processing unit 7 or the electron beam scanning unit 15 at the time of forward normal scanning and backward pre-charge scan. Since pre-charge scan in the backward path is carried out before normal scanning in the forward path, the scanning starts with backward scanning. Also, since the same line is scanned in the forward and backward paths, the deflection voltage Vy shifts every two lines. Moreover, since detection of secondary electrons is not carried out in pre-charge scan, the synchronizing signal is generated only at the time of forward scanning.

FIG. 11 is a flowchart for explaining the operation of the programmable sequencer 109 to realize the scanning shown in FIGS. 9 and 10. A micro program (test pattern) for this flowchart is downloaded in advance to the instruction memory 117 from the device control unit 6. The instruction memory 117 can be rewritten every scanning. However, if the instruction memory 117 has a capacity to store plural micro programs, it is a configuration capable of coping simply by arranging plural micro programs dividedly in the instruction memory 117 and changing a command calling address 221 of a micro program every scanning sequence.

In FIG. 11, the processing of steps S1101 to S1103 is the same as the processing of steps S801 to S803 in FIG. 8 and therefore explanation thereof is omitted.

In step S1107, the programmable sequencer 109 checks the branch flag 209 on each line. That is, the operation of the programmable sequencer 109 in this example is bifurcated into paths for forward processing and for backward processing according to the branch flag 209. The branch flag 209 is scheduled every scanning line by the scanning control unit 120, and the programmable sequencer 109 reads out the branch flag 209 for the corresponding scanning line from a branch flag storage unit 112 according to the line update command 215 at the start of the line. In the examples of scanning of FIGS. 9 and 10, by alternately scheduling the branch flag 209 indicating that the forward flow is selected and the branch flag 209 indicating the backward flow is selected, it is possible to carry out forward scanning and backward scanning alternately.

The processing after the forward and backward scanning processing is started is similar to the processing of FIG. 8. However, in this case, the difference in scanning direction and pixel information between forward scanning and backward scanning can be coped with by preparing plural register files in the pixel coordinates generating unit 113. Specifically, a scanning direction and a pixel pitch for forward path and for backward path are provided in a pixel coordinates register file of the pixel coordinates generating unit 113 used in the pixel coordinates command 219. Here, as the scanning direction, backward scanning can be realized by setting the pixel pitch at a negative value. Moreover, the difference from FIG. 8 is that if the scanning corresponding to the number of repetition lines is not completed in step S1113, the processing shifts to step S1107.

By providing register files where pixel information can be arbitrarily switched each scanning flow, and a branch command, as in this specific example, complex scanning sequences where the number of pixels, pixel pitch and scanning direction vary every line can easily dealt with.

Example 3

In this example, black stripe scanning will be described. As a form of scanning method, there is a scanning method in which an electron beam non-irradiation area is provided at one or both of the start point and the end point of a scanning line. In this example, the method is referred to as black stripe scanning. Also, as in Example 2, the overall configuration of the device is similar to FIG. 2 and FIG. 3(a), (b) described in Example 1 and therefore explanation thereof is omitted.

Figure 12:
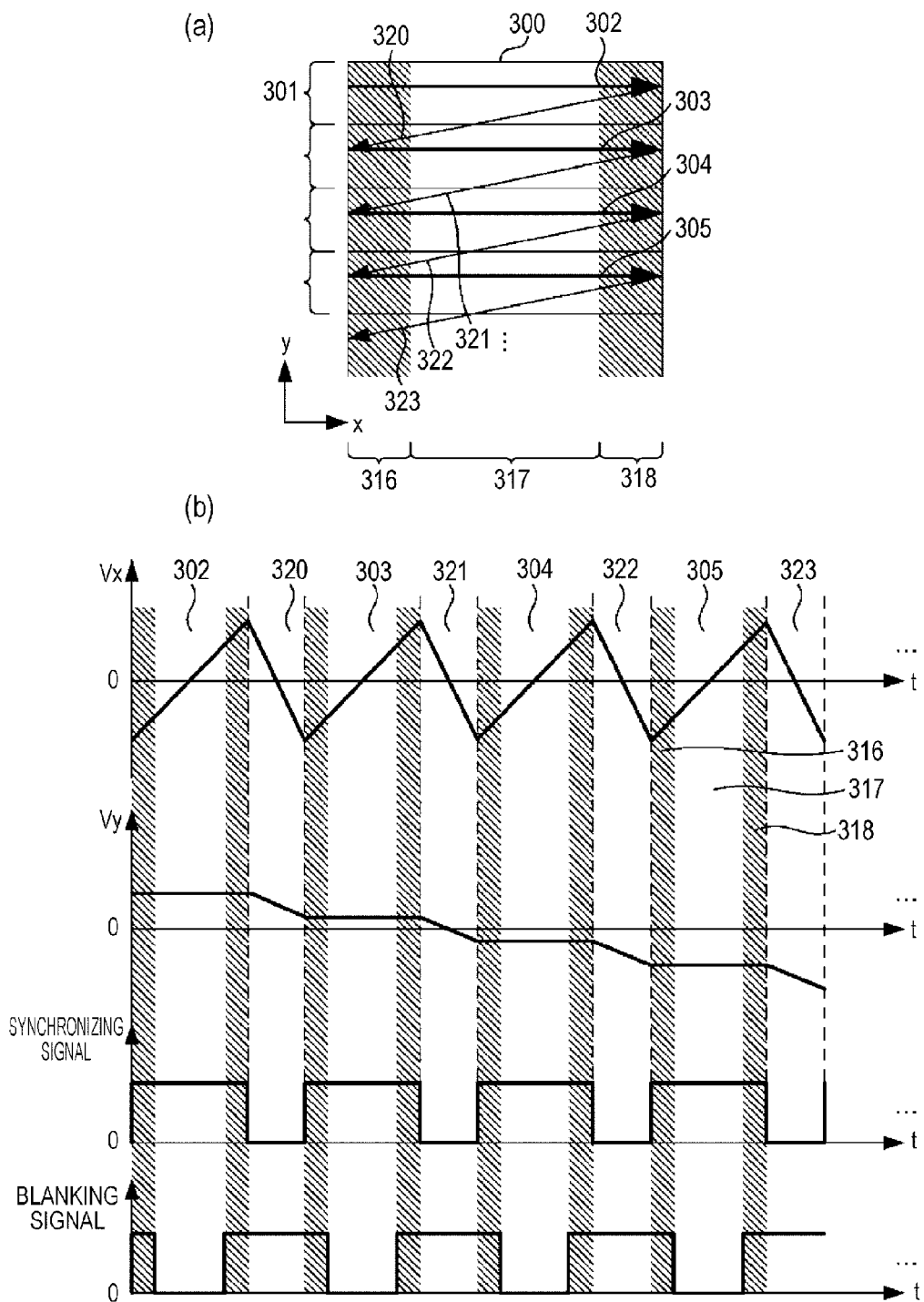
FIG. 12 It is a view showing an electron beam scanning operation in black stripe scanning.

FIGS. 12 and 17 are views for explaining an example of black stripe scanning. FIG. 12 shows a scanning method in which scanning of each line is carried out only by forward scanning, as in the above examples of basic scanning and variable-interval scanning. However, FIG. 12 shows an example scanning in which the electron beam is blanked in areas of several pixels at the beginning and several pixels at the end of a scanning line, thus omitting the irradiation of the inspection subject sample 9 and acquisition of an image. FIG. 12(b) shows the timing of the electron beam blanking signal 54 in addition to the voltages Vx, Vy and the synchronizing signal 53. The synchronizing signal 53 in FIG. 12(b) is valid synchronously with the slopes of the deflection voltages Vx, Vy, whereas the blanking signal 54 is invalid (that is, the electron beam is on) on inner sides of the scanning line, compared with the synchronizing signal 53.

Thus, electron beam non-irradiation areas are formed at the beginning of swing (top end) and the end of swing (bottom end) of the electron beam. Electro-optically unstable portion can be eliminated from an image signal and deterioration of inspection performance can be prevented. In other words, means for setting an end area that is not used by the above image comparison means is provided. Also, redundant electron beam irradiation of the sample is cut. The size of the non-irradiation area can be controlled by controlling the timing of fall or rise of the blanking signal in relation to the timing of rise or fall of the synchronizing signal.

Figure 13:
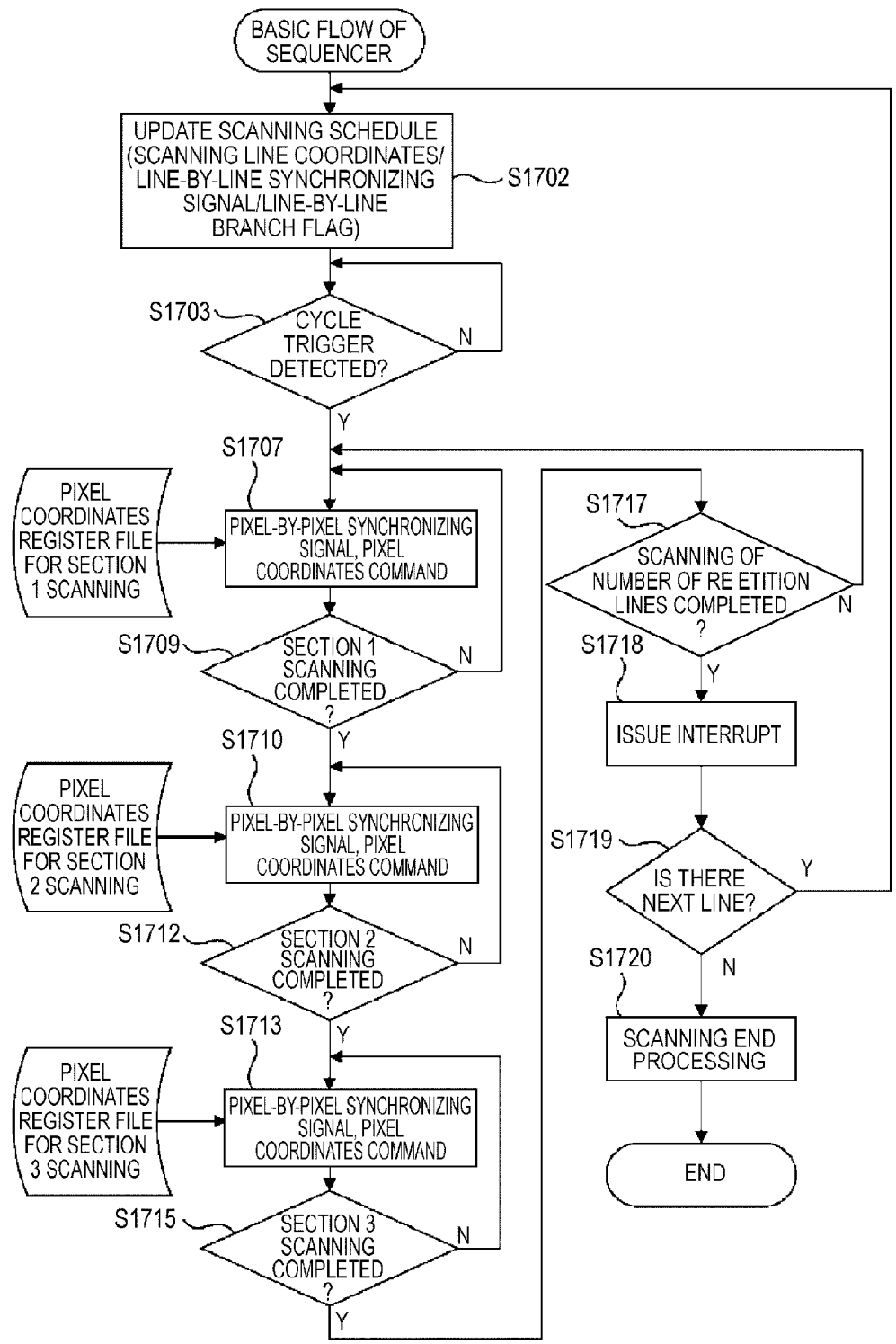
FIG. 13 It is a flowchart for explaining an operation of a programmable sequencer in black stripe scanning.

FIG. 13 is a flowchart for explaining the operation of the programmable sequencer 109 to realize the black stripe scanning shown in FIG. 12. The processing sequence of FIG. 13 is similar to the processing shown in FIG. 8 but different in the following processing. That is, the processing is different from FIG. 8 in that the processing is realized by dividing a scanning line into three sections of leading blank area 316, beam-on area 317 and terminal blank area 318, then providing a register file of pixel coordinates 212 corresponding to each of the scanning sections, and sequentially processing a scanning loop in each section. Also, the control of the synchronizing signal 53 and the blanking signal 54 in each section is controlled by the pixel-by-pixel synchronizing signal 216.

By enabling switching of the pixel coordinates command 219 and the accompanying register file on a pixel-clock-by-pixel-clock basis and providing means capable of controlling the synchronizing signal 53 and the blanking signal 54 similarly on a pixel-by-pixel basis, as in this specific example, scanning methods can be switched including the control of the synchronizing signal 53 and the blanking signal 54 on a pixel-by-pixel basis.

By the way, in the above descriptions, swing-back scanning, swing-back pre-charge scanning and black stripe scanning are described as examples of scanning sequence. However, if the micro program in the instruction memory is rewritten, various other scanning sequences can be realized. Also, as a matter of course, a combination of each of swing-back scanning, swing-back pre-charge scanning and black stripe scanning can be realized.

Example 4

In this example, an example of configuration of an operation screen GUI (Graphical User Interface) used commonly in the charged particle beam devices described in Examples 1 to 3 will be described.

Figure 14:
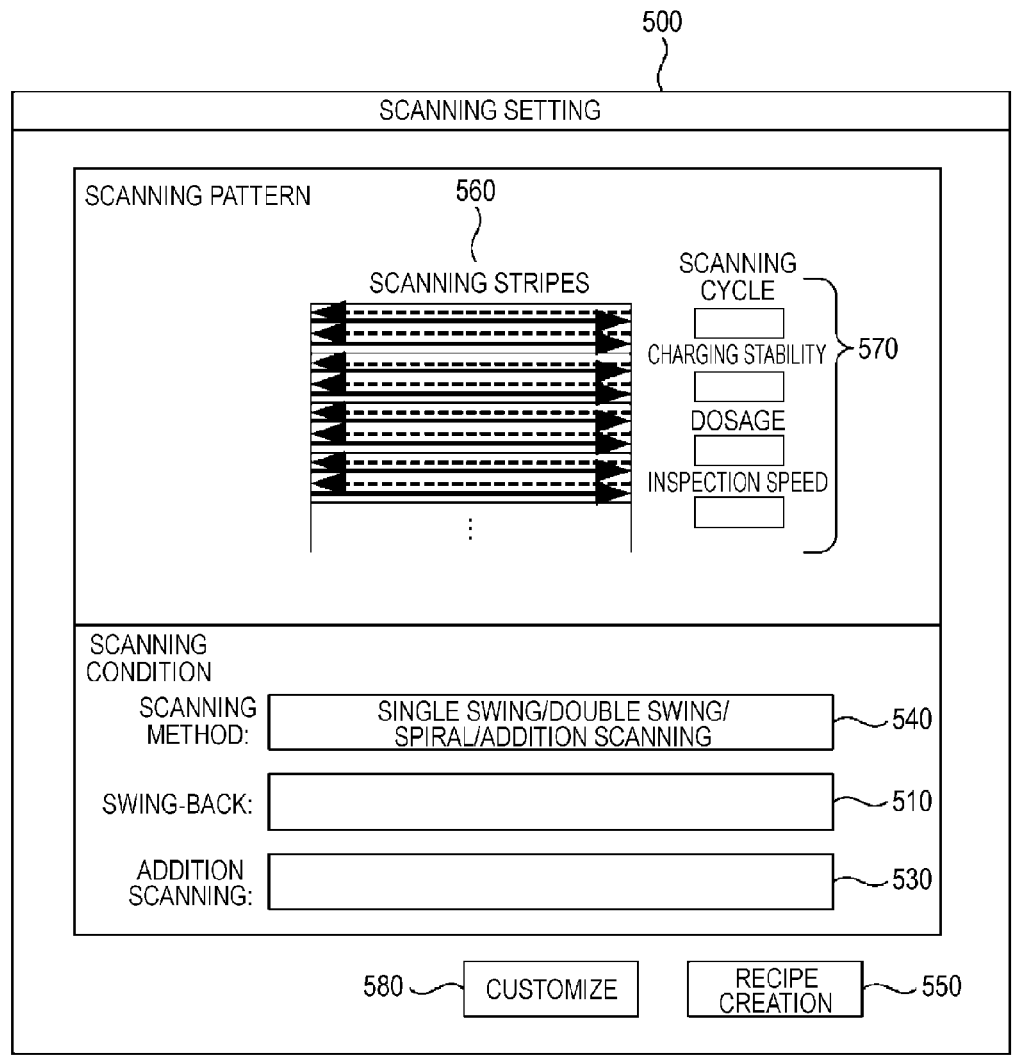
FIG. 14 It is a view showing an example of configuration of input/display means (GUI) employed in the charged particle beam devices of Examples 1 to 3.

FIG. 14 is a view showing an example of the GUI in this example. As shown in FIG. 14, an example in which scanning-type function selecting means according to this example is provided in display means 500 to enable the user to select various conditions with high visibility and operability (input screen (GUI) on a monitor 50) is described.

The user uses this GUI to select a scanning method with input means 540. This may be selection via a pull-down menu. Thus, the user can select a scanning method in one direction only (single swing), a scanning method in both directions with swing-back (double swing) and the like.

Next, detailed functions of each scanning method are selected with input means 510 and 530. First, with the input means 510, the role of swing-back in a scanning method which carries out swing-back is decided. That is, the user selects whether inspection image data is acquired (inspection) through swing-back or swing-back is used for pre-charge (P.C.) or discharge (D.C.). With the input means 530, other conditions (number of times forward and backward scanning is carried out or the like) are set.

As a result of the scanning conditions 231 set with the input means 540, 510 and 530, visually what kind of scanning is carried out is displayed on a scanning display 560. With this scanning display 560, the user can visually confirm whether the scanning conditions set by the user are met in the scanning. Also, means which enables the user to arbitrarily modify the scanning method on the scanning display 560 may be provided.

Moreover, inspection index display 570 which displays index volumes related to the quality and inspection throughput of the inspection decided by the scanning displayed on the scanning display 560 is provided. In this example, charging stability and scanning cycle at the time of each scanning are displayed as indices related to the quality of the inspection, and inspection speed is displayed as an index related to inspection throughput. Here, the input means 540, 510 and 530 are described. However, not all the input means need to be installed, and input means are not limited to these. Also, there is a technique in which various conditions are designated using a recipe creation mode 550, as a technique including all the above information. In this case, effort to input detailed information each time can be omitted and there also is an effect of reducing input errors. Thus, by inputting a defect type, process name or the like, inspection conditions can automatically be optimized, thus achieving an effect of improved usability.

Usually, plural micro programs and register file data that meet selectable scanning conditions are prepared in the device control unit 6. When a scanning condition is selected with the input means 540, a micro program and register file data that meet the condition are written in the instruction memory 117 of the scanning control unit 43 and a register file of the pixel coordinates generating unit 113.

Figure 15:
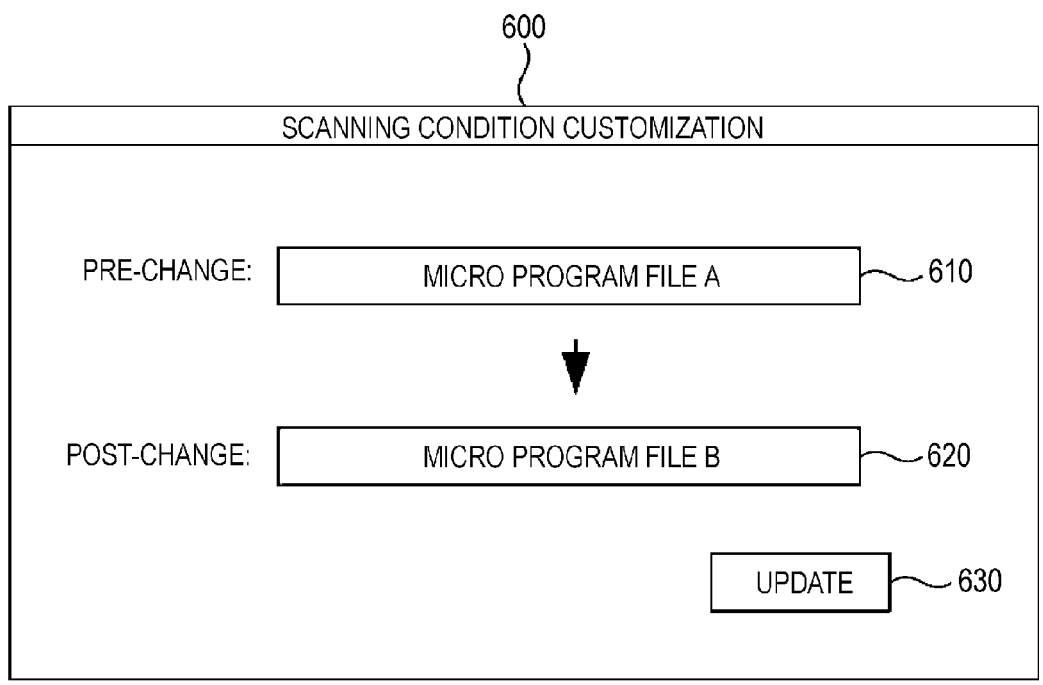
FIG. 15 It is a view showing an example of scanning condition customizing means which rewrites an instruction memory on GUI.

Moreover, means which enables arbitrary rewriting of a micro program is provided in order to customize scanning conditions in experiments, evaluations and the like. With a customize part 580, a scanning condition customization screen 600 shown in FIG. 15 is displayed. On the scanning condition customization screen 600, pre-change file name display means 610 which displays the file name of a micro program stored in the current instruction memory 117 and post-change file name designation means 620 which designates a micro program file intended for change are displayed. The user can designate a data file of an arbitrary micro program with the post-change file name designation means 620 and rewrite the content of the instruction memory 117 with update means 630. As a result of the update of the instruction memory 117, the changed scanning condition is displayed on the scanning display 560 and the content of change can be confirmed visually.

Also, this example can be realized by a program code of software which realizes each function. In this case, a storage medium in which the program code is recorded is provided in a system or device, and a computer (or CPU or MPU) of the system or device reads out the program code stored in the storage medium. In this case, the program code itself read out from the storage medium realizes the functions of the above embodiment, and the program code itself and the storage medium storing the program code constitute this example. As a storage medium to supply such a program code, for example, a flexible disk, CD-ROM, DVD-ROM, hard disk, optical disk, magneto-optical disk, CD-R, magnetic tape, non-volatile memory card, ROM or the like is used.

Also, an OS (operating system) operating on a computer may carry out a part or the whole of actual processing based on an instruction of the program code, and the functions of the above embodiment may be realized by that processing. Moreover, after the program code read out from the storage medium is written into a memory in the computer, the CPU or the like of the computer may carry out a part or the whole of actual processing based on an instruction of the program, and the functions of the above embodiments may be realized by that processing.

Also, a program code of software which realizes the functions of the embodiment may be distributed via a network, and thus the program code may be stored in storage means such as a hard disk or memory of a system or device, or a storage medium such as CD-RW or CD-R, and at the time of use, a computer (or CPU or MPU) of the system or device may read out and execute the program code stored in the storage means or the storage medium.

Moreover, in the above Examples 1 to 4, an inspection device to which a scanning electron microscope is applied is described as an example. However, as a matter of course, the technique can be applied to a device which scans a charged particle beam to acquire an image, for example, SEM-type defect review device, SEM-type length measuring device, scanning electron microscope or scanning ion microscope.

DESCRIPTION OF REFERENCE NUMERALS AND SIGNS 1 stage control unit
6 device control unit
7 image processing unit
9 inspection subject sample
10 electron gun
15 electron beam scanning unit
16 lens unit
20 detection unit
31 stage
43, 120 scanning control unit
53 synchronizing signal
54 blanking signal
109 programmable sequencer
110 trigger generating timer
111 synchronizing signal selector
113 pixel coordinates generating unit
117 instruction memory
118 scanning position calculating unit
119 synchronizing signal generating unit
200 position information
202 residual displacement
203 scanning line reference coordinates
207 cycle trigger
209 branch flag
211 cycle update command
212 pixel coordinates
213 amount of deflection
214 line-by-line synchronizing signal
215 line update command
216 pixel-by-pixel synchronizing signal
219 pixel coordinates command
225 memory rewriting
231 scanning condition
300 inspection stripes
301 line pitch
302, 303, 304, 305 forward scanning
306, 307, 308, 309 backward scanning
310, 311, 312, 313 pre-charge scanning
316 leading blanking area (section 1)
317 beam-on area (section 2)
318 terminal blanking area (section 3)
320, 321, 322, 323 swing-back scanning
350 time unevenness
351 cycle adjustment
500 display means
510, 530, 540 input means
550 recipe creation mode
560 scanning display
570 inspection index display
580 customize
600 scanning condition customization screen
610 pre-change file name display means
620 post-change file name designation means
630 update means

The invention claimed is:

1. A charged particle beam device configured for scanning a charged particle beam on a sample according to a predetermined scanning condition and detecting a secondary charged particle generated by the scanning, the device comprising:
a scanning scheduler configured for controlling a scanning cycle of the charged particle beam on a scanning-line-by-scanning-line basis in charged particle beam scanning, based on the scanning condition; and
a programmable sequencer configured to execute controlling an irradiating point of the charged particle beam on a pixel-by-pixel basis in the one scanning line consisting of a plurality of pixels according to an instruction from the scanning scheduler,
wherein the scanning scheduler is formed by a CPU and a memory, and
wherein the programmable sequencer is formed by a Field Programmable Gate Array.

2. The charged particle beam device according to claim 1, wherein the scanning scheduler is configured to generate scanning schedule information to manage a scanning order on the scanning-line-by-scanning-line basis.

3. The charged particle beam device according to claim 2, wherein the scanning scheduler is configured to generate the scanning schedule information, using one or plural scanning lines in the charged particle beam scanning as a unit.

4. The charged particle beam device according to claim 3, further comprising:
- a storage unit configured for storing the line scanning procedure information; and
- an updater configured for rewriting a content of the storage unit.

5. The charged particle beam device according to claim 4, wherein the line scanning procedure information includes a number of times line scanning is repeated, pixel pitch, and information of line scanning direction, and
- the programmable sequencer is configured to switch the number of times the line scanning is repeated, the pixel pitch and the line scanning direction every scanning sequence.

6. The charged particle beam device according to claim 5, wherein the scanning scheduler is configured to synchronize beam scanning control of the programmable sequencer, based on a trigger issued cyclically by the scanning scheduler.

7. The charged particle beam device according to claim 6, wherein the scanning scheduler is configured to adjust a trigger issue cycle every time beam scanning of a single scanning line or a combination of plural scanning lines by the programmable sequencer is completed.

8. The charged particle beam device according to claim 7, further comprising:
- a synchronizer configured for detecting a signal from beam scanning and a sample, comprising:
- a scanning-line-by-scanning-line synchronizing signal generator, a pixel-by-pixel synchronizing signal generator, and a selector configured for switching each synchronizing signal depending on a scanning condition.

9. The charged particle beam device according to claim 8, further comprising:
- a display unit configured to display a setting screen for setting a scanning condition of the charged particle beam scanning,
- wherein visual information showing a content of the scanning schedule information and a content of scanning executed based on the scanning schedule information is displayed on the setting screen.

* * * * *